US006509848B1

(12) United States Patent
Ogata et al.

(10) Patent No.: US 6,509,848 B1
(45) Date of Patent: Jan. 21, 2003

(54) REMOTE CONTROL DEVICE

(75) Inventors: Hiroki Ogata, Chiba (JP); Kazusato Tagawa, Chiba (JP); Hiroyuki Nakazawa, Chiba (JP)

(73) Assignee: Sony Computer Entertainment Inc. (JP)

( * ) Notice: Subject to any disclaimer, the term of this patent is extended or adjusted under 35 U.S.C. 154(b) by 67 days.

(21) Appl. No.: 09/658,617

(22) Filed: Sep. 8, 2000

(30) Foreign Application Priority Data

Sep. 10, 1999 (JP) ........................................... 11-256565
Mar. 3, 2000 (JP) ...................................... 2000-059483

(51) Int. Cl.[7] ............................................... H03K 17/94

(52) U.S. Cl. ......................... 341/34; 341/176; 200/515; 463/37

(58) Field of Search .................. 341/34, 176; 345/169; 200/511, 512, 515; 463/36, 37

(56) References Cited

U.S. PATENT DOCUMENTS

| | | | |
|---|---|---|---|
| 4,924,960 A | 5/1990 | Crill | |
| 5,164,697 A | 11/1992 | Kramer | 338/69 |
| 5,349,370 A | 9/1994 | Katayama et al. | |
| 5,640,152 A | 6/1997 | Copper | |
| 5,659,334 A | 8/1997 | Yaniger et al. | |
| 5,832,296 A | 11/1998 | Wang et al. | 395/823 |
| 6,208,271 B1 * | 3/2001 | Armstrong | 341/34 |

FOREIGN PATENT DOCUMENTS

| | | |
|---|---|---|
| DE | 3543890 A1 | 6/1987 |
| FR | 2692419 A | 12/1993 |
| JP | 1-140636 | 9/1989 |
| JP | 6-38015 | 5/1994 |
| JP | 8-084076 A | 3/1996 |
| JP | 3040155 | 5/1997 |

* cited by examiner

*Primary Examiner*—Timothy Edwards, Jr.
(74) *Attorney, Agent, or Firm*—Lerner, David, Littenberg, Krumholz & Mentlik, LLP

(57) ABSTRACT

A remote control device for remotely controlling an AV (audio visual) device includes an analog switch (30) formed of an operating element (31 or 41) and a pressure-sensitive resistor (35) which outputs a signal with various levels depending upon a pressing force applied to the operating element (31 or 41). By employing the analog switch (30 ) in a control button of the remote control device, it becomes possible to output a signal having various levels depending upon a pressing force applied to the control button (31 or 41). This allows a single control button to be used for a plurality of functions. Thus, it is possible to reduce the number of buttons, and a user can easily operate the remote control device in a simpler fashion.

8 Claims, 10 Drawing Sheets

REMOTE CONTROL DEVICE

FIELD OF THE INVENTION

The present invention relates to a remote control device for controlling an electronic device, and more particularly, to a remote control device for controlling an AV (audio visual) device such as a VCR and a stereo.

BACKGROUND OF THE INVENTION

Remote control devices are widely used to remotely control AV devices such as television sets, video recording/playback devices, and stereo recording/playback devices. A remote control device for controlling such an AV device includes a power button, volume control buttons, channel selection buttons, and various other control buttons. For example, when the remote control device is used to control a video player, the remote control device further includes various control buttons such as a play button, a fast-forward button, and a rewind button.

However, control buttons provided on such a conventional remote control device can output only a digital signal representing whether or not a control button is pressed. Therefore, in order to realize a function such as a rewinding operation at different levels such as normal speed, double speed, and quadruple speed, it is required to provide as many control buttons for one function as there are levels for that function. Thus, the remote control device needs a large number of control buttons, and it becomes complicated for a user to operate the remote control device. In particular, when a single remote control device is used to control a plurality of electronic devices such as a television set and a video recording/playback device, a very complicated operation is required to use the remote control device.

SUMMARY OF THE INVENTION

It is an object of the present invention to provide a remote control device which can be used in a simple fashion to control a large number of functions.

According to an aspect of the present invention, in order to achieve the above object, a remote control device for controlling an electronic device includes an analog switch having an operating element capable of being passed down and a pressure-sensitive resistor for outputting a signal having various levels depending upon a pressing force applied to the operating element.

In this remote control device according to the present invention a control button can be formed of the analog switch including the pressure-sensitive resistor thereby making it possible to use one button for a plurality of functions depending upon the pressing force applied to the operating element. Thus, it is possible to reduce the number of buttons, and a user can easily operate the remote control device in a simpler fashion. For example, in the case where the analog switch is used in a rewind button, it becomes possible to use the same rewind button to control the rewinding operation at various speeds such that when the rewind button is pressed with a weak force, a normal-speed rewind command is output, medium-force pressing generates a double-speed rewind command, and strong-force pressing generates a quadruple-speed rewind command. Thus, it becomes possible to control various functions using a smaller number of control buttons in a simpler fashion.

The pressure-sensitive resistor may be realized in various ways. For example, the pressure-sensitive resistor may be realized using an element whose conductivity various depending upon the pressure applied to it. Alternatively, the pressure-sensitive resistor may also be realized by employing a structure in which the contact area between a resistor and a conductive element is varied depending upon the applied pressure.

Preferably, the remote control device includes an analog-to-digital (A/D) converter for converting an analog signal output from the analog switch into a digital signal.

More specifically, the output signal of the pressure-sensitive resistor, which varies continuously in response to the applied pressure, is classified into one of predetermined voltage levels by performing A/D conversion using the A/D converter. Thus, it becomes possible for the remote control device to output a digital signal with one of a number of discrete levels.

An advantage of outputting a digital signal with one of a number of discrete level from the remote control device is that the output signal corresponding to the pressing force applied to the operating element is correctly transmitted to the electronic device without being affected by noise.

The remote control device preferably further includes a level correction unit for correcting the upper and lower limits of the analog signal output from the analog switch to corresponding calibrated levels.

More specifically, variable resistors are disposed in parallel with the pressure-sensitive resistor, and the resistance of the variable resistors is adjusted so that the output level of the pressure-sensitive resistors is adjusted to a correct level thereby ensuring that the output signal level precisely corresponds to the pressing force regardless of variations or deviations in the resistance.

The level correction unit is disposed at a preceding stage of the A/D converter so that a signal precisely corresponding to the applied pressing force is output.

The remote control device may be employed to control various types of electronic devices. In particular, the remote control device may be advantageously used to control an information reading/writing device for reading and/or writing information such as a sound or an image from/onto a recording medium.

Examples of such information reading/writing devices include a CD/DVD player for reading data recorded on an optical disk such as a compact disk, a CD-ROM, a DVD, and a DVD-ROM serving as a recording medium, and a video record/playback device for reading and/or writing data from/into a tape-shaped recording medium such as a videotape.

The advantage of employing the remote control device according to the present invention to control such an information reading/writing device is that a large number of functions such as a tape fast-forward operation, a tape rewind operation, and a skipping operation of musical pieces recording on a compact disk can be realized in a simple fashion.

When the electronic device to be controlled is one of such information reading/writing devices, it is preferable that an analog switch according to the present invention be disposed in a retrieval control button for retrieving information recorded on a recording medium or disposed in a stop button for stopping a data reading or writing operation from or to, respectively, the recording medium.

In general, the retrieval operation needs a fast-forward operation, a rewind operation, and a skip operation, and it is desirable that these operations can be performed at a desired speed selected from normal, double, and quadruple speeds.

By employing the analog switch in the control buttons for controlling such operations, it becomes possible to control the retrieval speed at a desired level selected from predetermined discrete levels. This allows a user to control the operation in an easier and more natural fashion.

When the analog switch is employed in the stop bottom, it becomes possible to control the stopping operation in a desired mode selected from multiple modes including, for example, a pause mode and a completely stopped mode.

DESCRIPTION OF THE PREFERRED EMBODIMENTS

An embodiment of the present invention will be described in further detail below with reference to the accompanying drawings.

Figure 1:
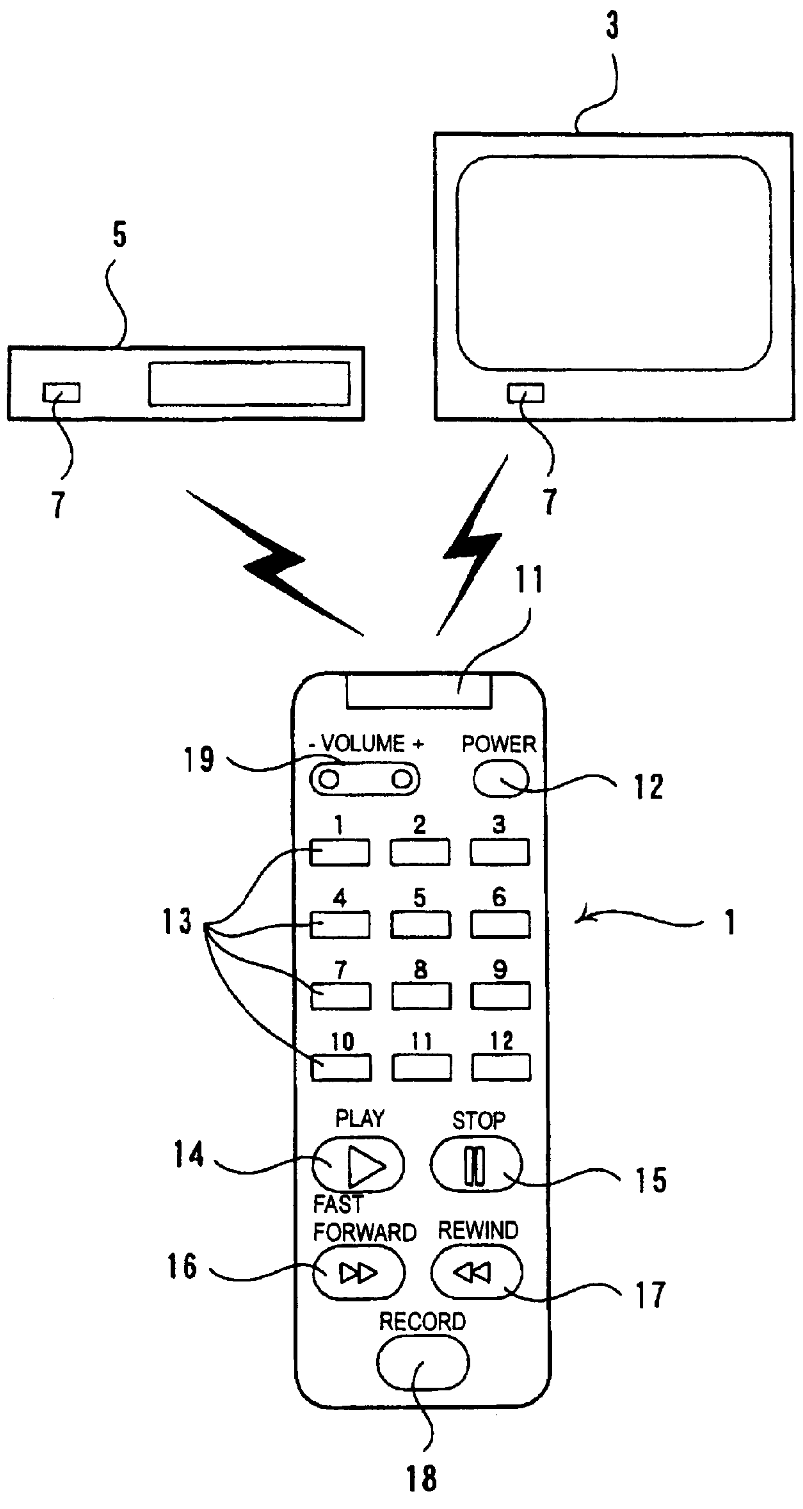
FIG. 1 is a schematic diagram illustrating an embodiment of a remote control device according to the present invention and electronic devices to be controlled.

FIG. 1 illustrates a remote control device 1 according to an embodiment of the present invention. In FIG. 1, the remote control device 1 is used to remotely control a television set 3 and a video recording/playback device 5. The remote control device 1 communicates with the television set 3 and the video recording/playback device 5 via a wireless communication system using an infrared light emitting diode (LED). For communication between the remote control device 1 and the television set 3 or the video recording/playback device 5, a transmitting device 11 including the infrared LED is disposed on the front side of the remote control device 1, and a receiving device 7 for detecting an infrared ray is disposed on the front side of the television set 3 and also on the front side of the video recording/playback device 5. A control signal output from the remote control device 1 is transmitted from the transmitting device 11 and received by the receiving device 7 of the television set 3 or the video recording/playback device 5. The television set 3 and the video recording/playback device 5 operate in accordance with the received control signal.

The remote control device 1 includes a plurality of control buttons for controlling the operation of the television set 3 or the video recording/playback device 5. More specifically, the control buttons include a power button 12 for turning on/off the power of the television set 3 or the video recording/playback device 5, a plurality of channel selection buttons 13 for selecting a channel of the television set 3 or the video recording/playback device 5, a playback button 14 for commanding the video recording/playback device 5 to perform a playback operation, a stop button 15, a fast-forward button 16, a rewind button 17, a record button 18, and volume control buttons 19 for controlling the sound level generated by a loudspeaker disposed on the television set 3.

Of these control buttons, the stop button 15, the fast-forward button 16, and the rewind button 17, for controlling the operation of the video recording/playback device 5, are each formed using an analog switch including a pressure-sensitive resistor so as to realize a multi-level capability. The other control buttons are each formed of a digital switch capable of outputting one of two levels specifying either "active" or "inactive".

Figure 2:
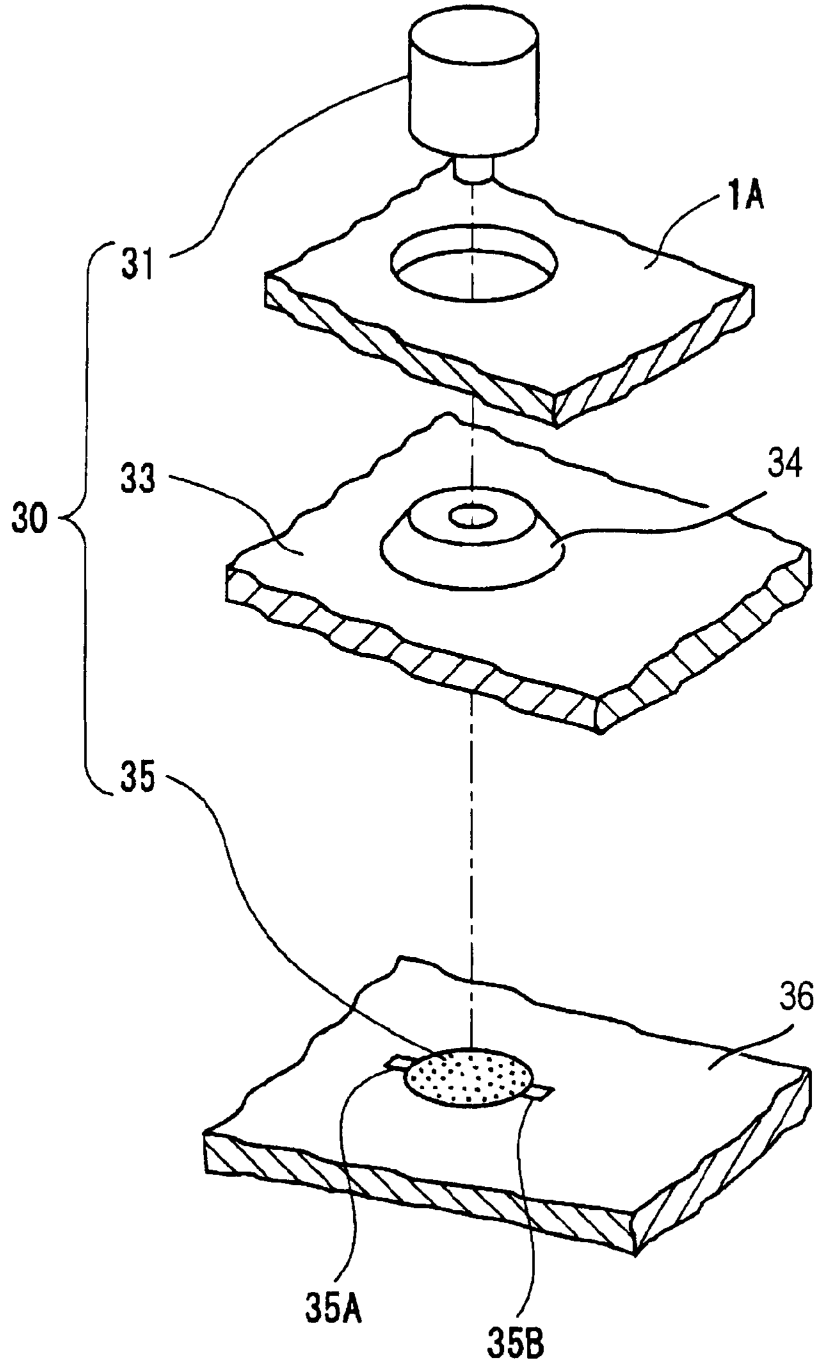
FIG. 2 is an exploded perspective view illustrating an example of an analog switch used in the embodiment of the remote control device.

The multi-level control buttons having the above pressure-sensitive resistors each include, as shown in FIG. 2, an analog switch 30 comprising an operating element 31, an elastic element 33, and a pressure-sensitive resistor 35.

The operating element 31 is fitted in a main body 1A such that the head portion of the operating element 31 is exposed above the upper surface of the main body 1A and such that the operating element 31 is movable in a direction along the axis of the operating element 31. The elastic element 33 is formed of insulating rubber or the like and has an elastic part 34. The upper surface of elastic part 34 of the elastic element 33 supports the lower end of the operating element 31. When the operating element 31 is pushed down in its axial direction, the sloped side face of the elastic part 34 of the elastic element 33 is deformed, and the upper surface of the elastic part 34 sinks down together with the operating element 31. If the pressing force imposed upon the operating element 31 is removed, the sloped side face of the elastic part 34 elastically returns from the deformed shape to its original shape and pushes up the operating element 31. Thus, the elastic element 33 serves as biasing means for restoring the operating element 31 to the original position from the pushed-down position.

A plurality of the pressure-sensitive resistors 35 are formed on a thin insulating sheet 36 such that each pressure-sensitive resistor 35, the corresponding operating element 31, and the upper surface of the elastic part 34 of the corresponding elastic element 33 are substantially aligned on the same vertical line whereby the pressing force imposed upon the operating element 31 is applied to the corresponding pressure-sensitive resistor 35 via the elastic part 34 of the elastic element 33.

The pressure-sensitive resistor 35 may be formed of, for example, pressure-sensitive conductive rubber. The pressure-sensitive resistor 35 includes electrodes 35A and 35B disposed at symmetrical locations on the insulating sheet 36. The electrical resistance between the electrodes 35A and 35B varies depending upon the force applied to the pressure-sensitive resistor 35.

An example of the pressure-sensitive resistor 35 formed of pressure-sensitive rubber is described below. The pressure-sensitive rubber includes non-conductive rubber containing conductive particles such as carbon or metal particles. When the pressure-sensitive conductive rubber is compressed by a pushing-down pressure, the density of conductive particles increases and thus the overall resistance decreases. If the pushing-down pressure is removed, the pressure-sensitive conductive rubber returns to the original form and the density of conductive particles returns to its original value. As a result, the overall resistance returns to the original value. More specifically, when The pushing-down force (stress) increases from Level 1 toward Level 5 in FIG. 3, the resistance increases as represented by a broken line, and the output voltage of the pressure-sensitive resistor 35 in a circuit shown in FIG. 8 (that is, the voltage across the pressure-sensitive conductive rubber), that is, the voltage input to a level correction unit 531, increases.

Figure 3:
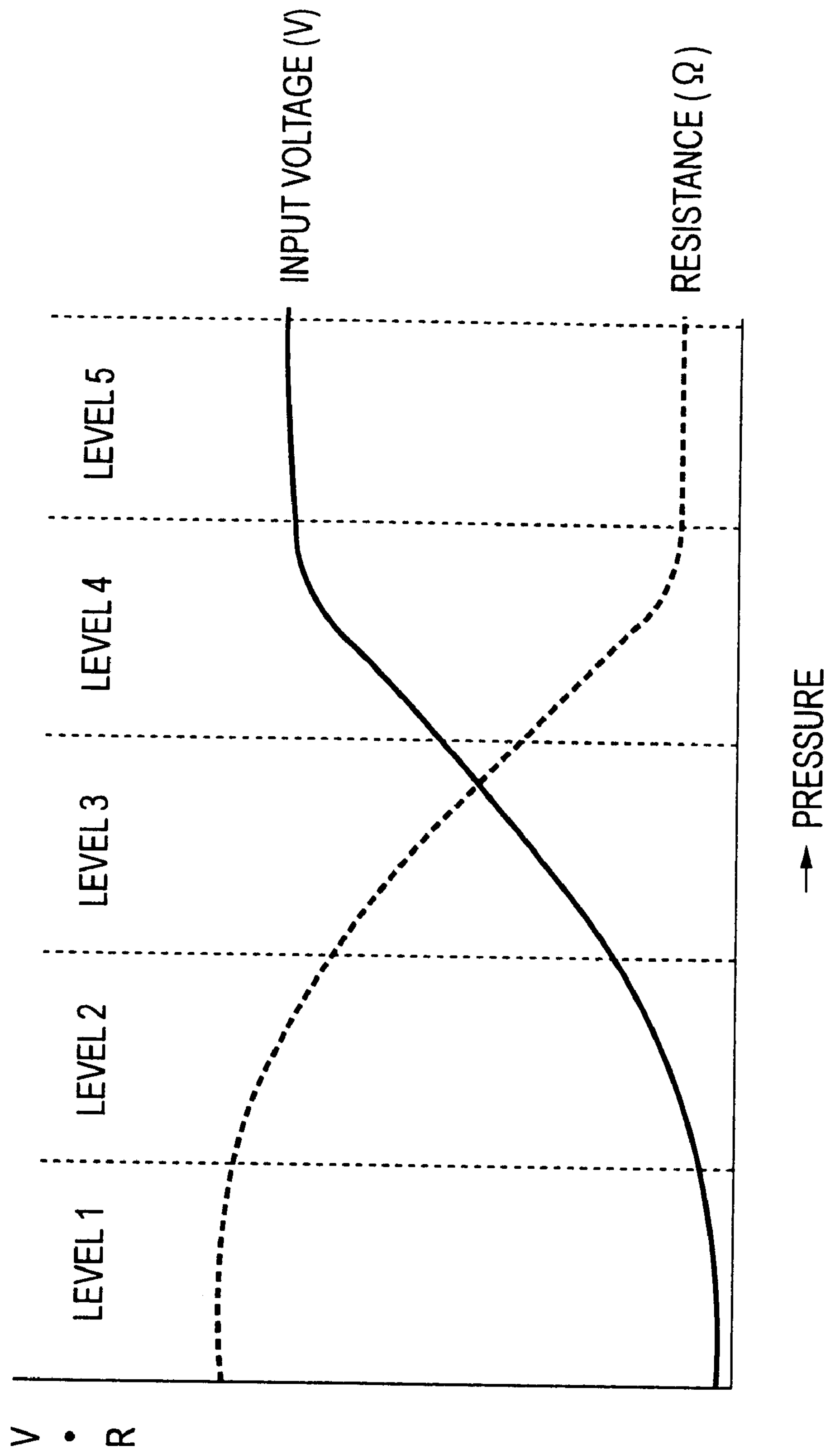
FIG. 3 is a graph illustrating an example of the dependence of the resistance of a pressure-sensitive register used in the analog switch according to the embodiment upon a pressing force applied to the pressure-sensitive resistor.
Figure 4:
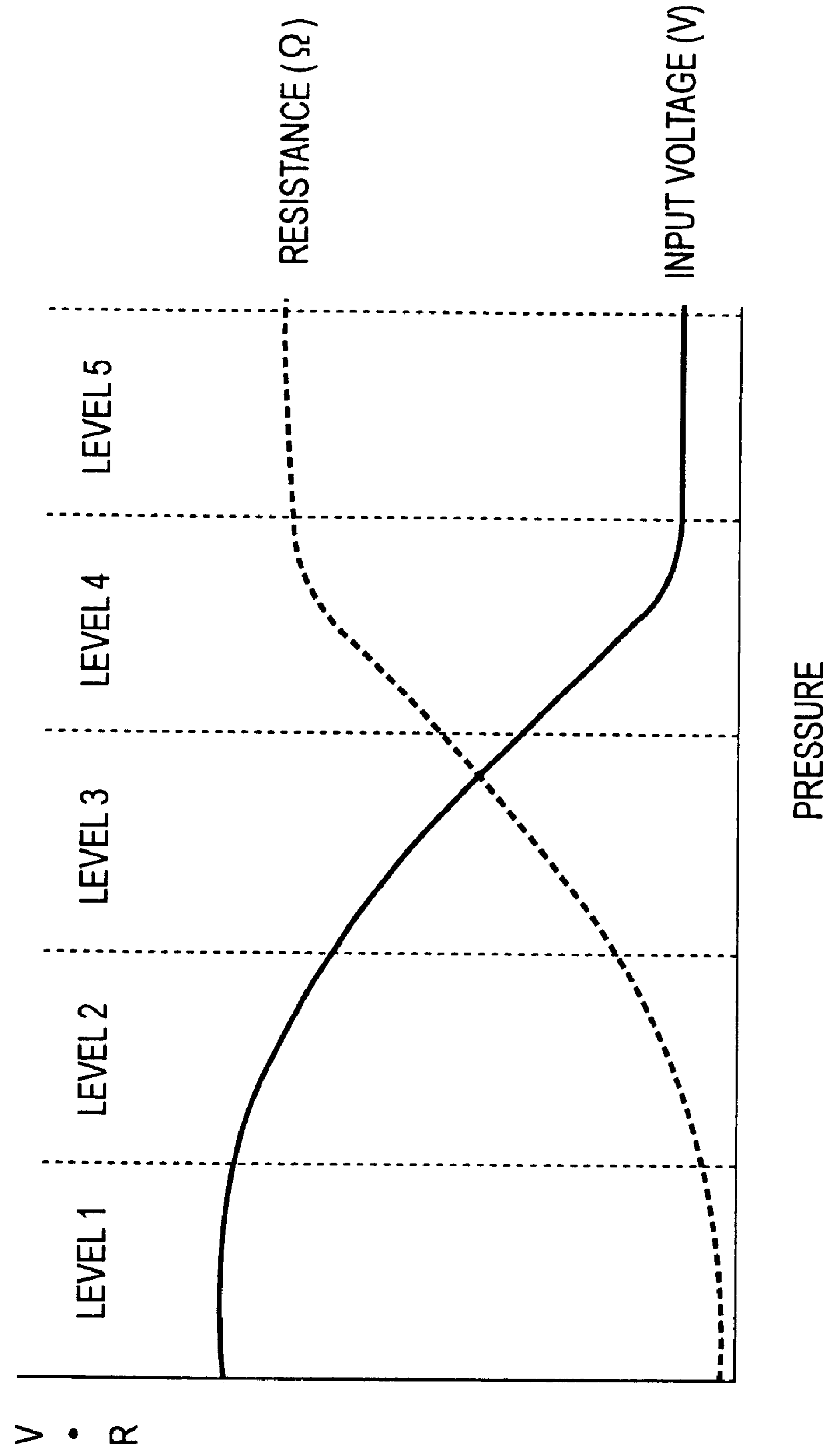
FIG. 4 is a graph illustrating another example of the dependence of the resistance of the pressure-sensitive resistor used in the analog switch according to the embodiment upon a pressing force applied to the pressure-sensitive resistor.

FIG. 4 illustrates another example of the characteristics of a pressure-sensitive resistor 35 formed of pressure-sensitive rubber. In this example, unlike the characteristics shown in FIG. 3, the resistance of the pressure-sensitive resistor 35 increases with increasing stress imposed upon the pressure-sensitive resistor 35 caused by an applied pressing force. More specifically, when the pushing-down force increases from Level 1 toward Level 5 in FIG. 4, the resistance increases as represented by a broken line, and the output voltage of the pressure-sensitive resistor 35 in the circuit shown in FIG. 8, that is, the voltage input to the level correction unit 531, decreases. An example of such that a pressure-sensitive resistor is available from such as a piezo-electric transducer.

Figure 5A:
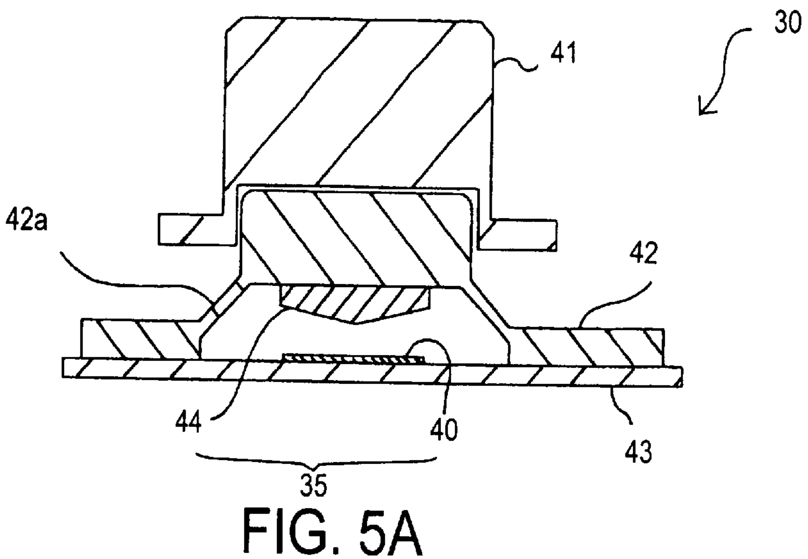
FIGS. 5A and 5B, and 5*c* are cross-sectional views illustrating another example of operated states of an analog switch used in the embodiment of the remote control device.
Figure 5B:
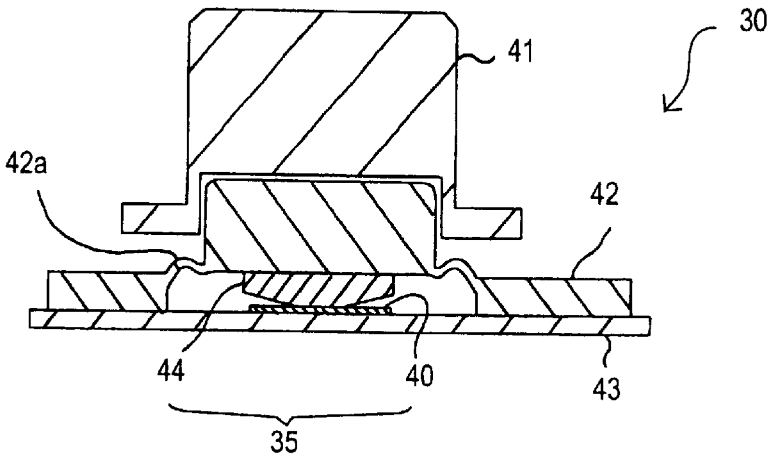
Figure 5C:
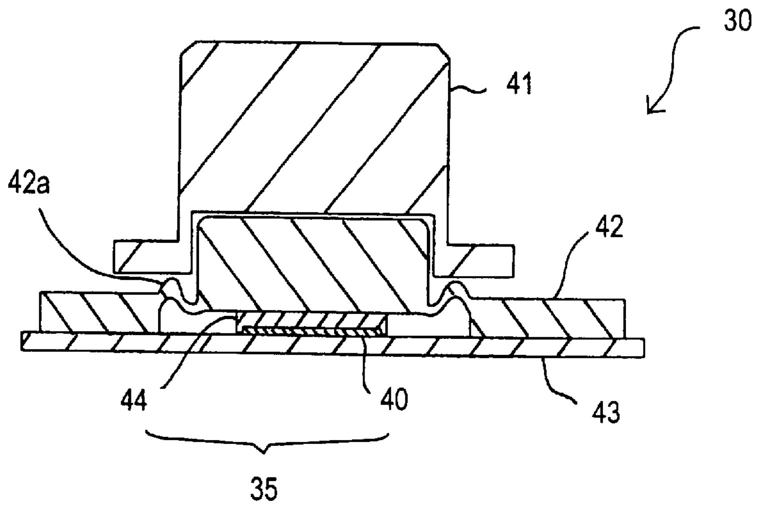

FIGS. 5A to 5C illustrate an alternative along switch 30 having a structure different from that shown in FIG. 2. As shown in FIG. 5A, the analog switch 30 includes an operating button 41 having the same function as that of the operating element 31, an elastic element 42 similar to the elastic element 33, a conductive element 44, and a resistor 40 wherein the combination of the conductive element 44 and the resistor 40 provides a similar function to that of the pressure-sensitive resistor 35.

The conductive element 44 may be formed of, for example, elastic conductive rubber so as to have a convex shape whose thickness is greatest at the center. The conductive element 44 is adhesively connected to the lower surface of the upper portion of an elastic part 42*a* formed on the elastic element 42. The resistor 40 is disposed on an inner substrate 43 such that the resistor 40 and the conductive element 44 face each other and such that the conductive element 44 comes into contact with the resistor 40 when the push button 41 is pushed down.

The conductive element 44 is deformed to a degree depending upon the pushing-down force applied by the push button 41 (that is, depending upon the contact pressure imposed during contact with the resistor 40). As result, the contact area between the conductive element 44 and the resistor 40 varies as shown in FIGS. 5B and 5C. When the pushing-down force applied by the push button 41 is weak, the surface area near the thickest portion of the conductive element 44 comes into contact with the resistor 40 as shown in FIG. 5B. If the pushing-down force applied by the push button 41 increases, the deformed portion of the conductive element 44 extends from the thickest portion. As a result, the contract area increases.

Figure 6:
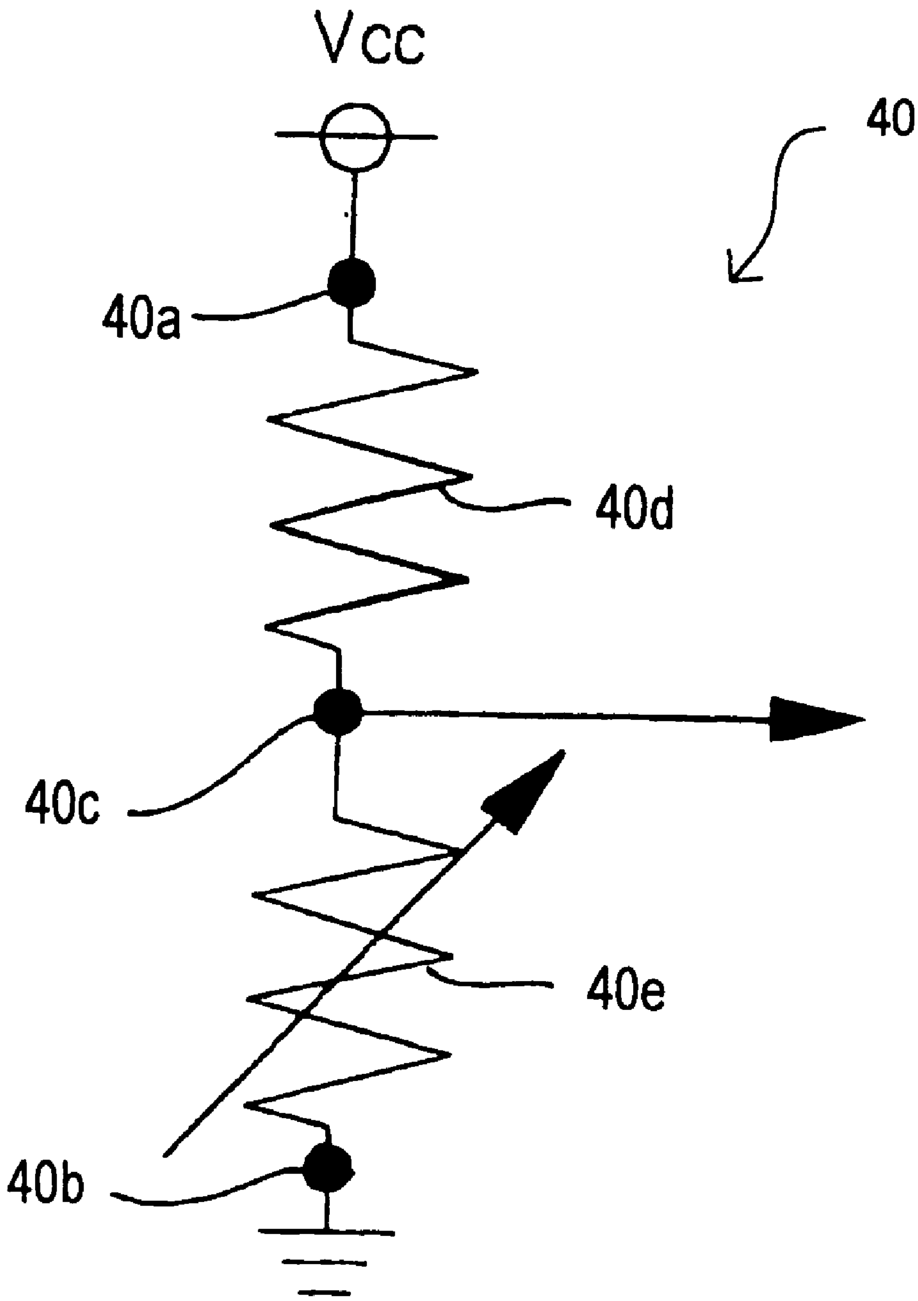
FIG. 6 is a circuit diagram illustrating a pressure-sensitive resistor connected to a power supply line.

The resistor 40 is connected to a power supply line as shown in FIG. 6. More specifically, the resistor 40 is connected in series to power supply line Vcc so that a voltage is applied between electrodes 40*a* and 40*b*. The resistor 40 can be represented by an equivalent circuit consisting of a fixed resistor 40*d* and a variable resistor 40*e*, as shown in FIG. 6. Herein, the variable resistor 40*e* corresponds to a portion of the resistor 40 in contact with the conductive element 44 and the resistance of the variable resistor 40*e* varies depending upon the area in contact with the conductive element 44. That is, when the conductive element 44 comes into contact with the resistor 40, the conductive element 44 provides a bridge through which a current flows, and thus the resistance of the contacting portion (variable resistor 40*e*) decreases.

In the present embodiment, one end of the variable resistor 40*e* is connected to the ground line of the power supply. An output terminal 40*c* is disposed at the node between the fixed resistor 40*d* and the variable resistor 40*e* of the resistor 40 such that an analog signal corresponding to the pushing-down force applied by the push button 41 is output at the output terminal 40*c*. With an increase in the pushing-down force applied by the push button 41, the resistance of the variable resistor 40*e* decreases, and thus the voltage level of the analog signal output at the output terminal 40*c* decreases.

Figure 7:
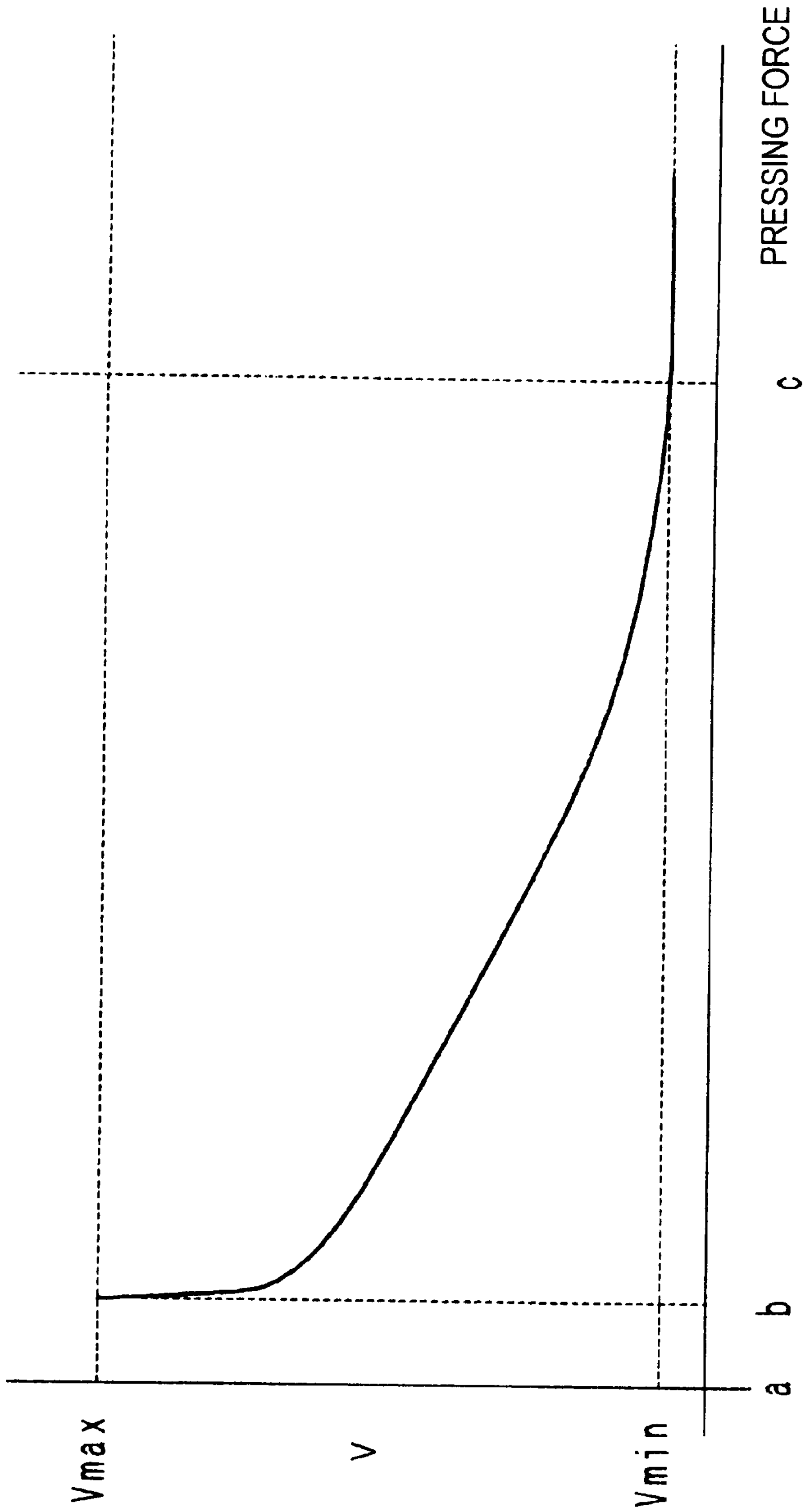
FIG. 7 is a characteristic graph illustrating an analog voltage output by the sensitive—sensitive resistor as a function of a pressing force applied thereto.

FIG. 7 illustrates characteristics of the analog signal (voltage) output at the output terminal 40*c* of pressure-sensitive resistor consisting of the resistor 40 and the conductive element 44. When the push button 41 is not pushed at all, the analog signal (voltage) output at the output terminal 40*c* has a value Vmax (point a in FIG. 7) determined by the supply voltage Vcc applied to the resistor 40. Even if the push button 41 is pushed down, the voltage of the analog signal is maintained at Vmax until the conductive element 44 comes into contact with the resistor 40 and thus the resistance of the variable resistor 40*e* of the resistor 40 starts to vary.

When the conductive element 44 comes into contact with the resistor 40 (point b in FIG. 7) as a result of further pushing-down of the bush button 41, the contact area between the resistor 40 and the conductive element 44 increases depending upon the pushing-down force applied by the push button 41, and the resistance of the variable resistor 40*e* of the register decreases. As a result, the analog signal (voltage) output at the output terminal 40*c* decreases. When the conductive element 44 is deformed to the maximum extent, the analog signal (voltage) output at the output terminal 40*c* has a minimum value Vmin (point c in FIG. 7). Thus, in the pressure-sensitive resistor 35 constructed in the above-described manner, the resistance decreases with increasing pressing force.

Figure 8:
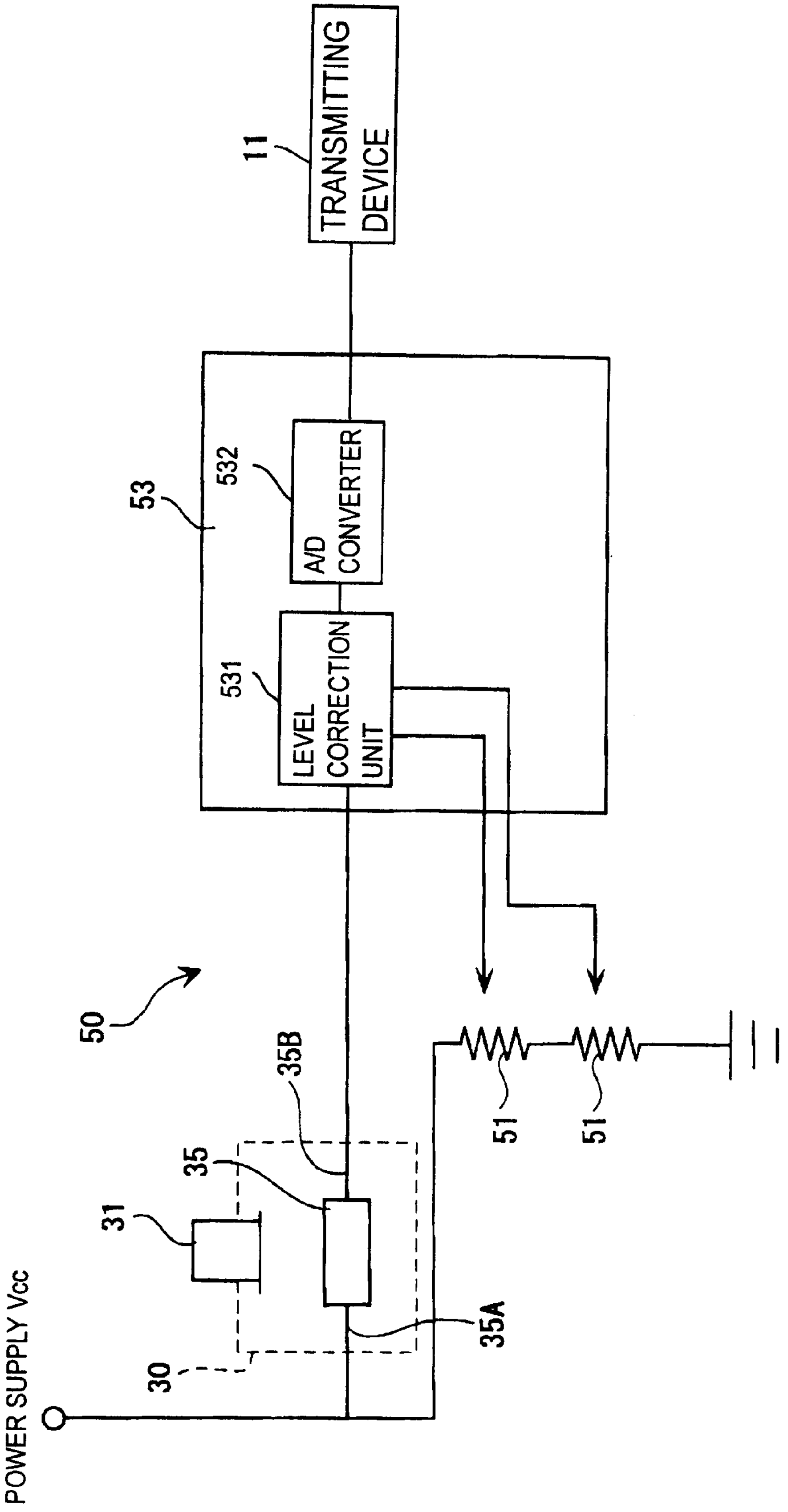
FIG. 8 is a circuit diagram illustrating a signal processing circuit connected to the analog switch according to the embodiment.
Figure 9:
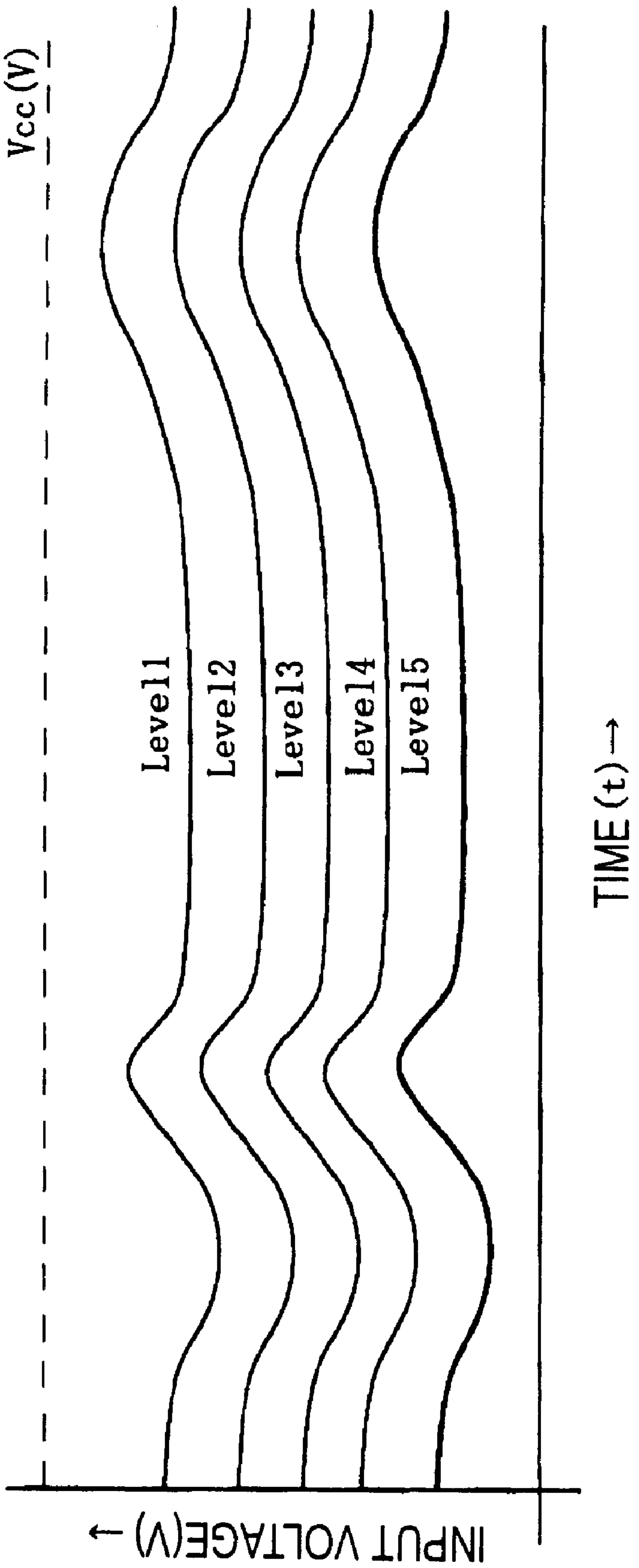
FIG. 9 is a graph used to explain a method of setting signal levels of a control button including the analog switch according to the embodiment.

Examples of the analog switch 30 have been described above with reference to FIGS. 2 and 5A to 5C, and it has been described that the pressure-sensitive resistor 35 in the analog switch 30 may be formed of an element having various pressure-resistance characteristics such as those described in FIGS. 3, 4, and 7. The change in the resistance corresponding to the change in the pushing-down force applied to the pressure-sensitive resistor 35 is electrically processed by a signal processing circuit 50 provided in the remote control device 1, as shown in FIG. 8.

The signal processing circuit 50 includes the pressure sensitive resistor 35 described above, a series of two variable resistors 51 which are together connected in parallel with the pressure-sensitive resistor 35, and a microcomputer 53 to which the output voltage of the pressure-sensitive resistor 35 is input, wherein the power supply voltage Vcc is applied to one electrode 35A (corresponding to the electrode 40*a* shown in FIG. 6) of the pressure-sensitive resistor 35.

The microcomputer 53 includes the level correction unit 531 and an analog-to-digital (A/D) circuit converter 532. The microcomputer 53 detects the level of a signal which is output by the pressure-sensitive resistor 35 when a maximum stress is imposed thereon by an operation performed by a user, and the microcomputer 53 divides the range between the detected signal level and the power supply voltage Vcc so as to define a plurality of signal level corresponding to the pressing force applied to the pressure-sensitive resistor 35. More specifically, as shown in FIG. 8, the microcomputer 53 first detects a voltage which is output by the pressure-sensitive resistor 35 when a maximum stress is implied, and the microcomputer 53 sets Level 5 (maximum level) in FIG. 3 or 7 to be equal to the detected signal level. The microcomputer 53 then defines signal levels 1 to 4, within the range from Level 5 to the power supply voltage Vcc so that a signal at Level 1 is output when a user presses the operating element 31 (41 in FIG. 5A) with a weak force and the level of the output signal increases from level 2 to levels 5 with increasing pressing force.

The level correction unit 531 corrects input level of the pressure-sensitive resistor, i.e., corrects the upper and lower limits of output of the pressure-sensitive resistor 35 to calibrated levels, before performing the above-described setting of the signal levels. In the present embodiment, the level correction unit 531 supplies a control signal to the variable resistors 51 to adjust the resistance of the variable resistors 51 thereby correcting the output level of the pressure-sensitive resistor 35. More specifically, the maximum and minimum output levels of the pressure-sensitive resistor 35 are corrected on the basis of the maximum and minimum values of the variable resistors 51, and the respective output levels are then determined between the maximum and minim levels.

The signal level detected by the microcomputer 53 is then converted to a digital signal by the A/D converter 532. The resultant signal is output to the transmitting device 11 in the remote control device 1. In the analog-to-digital conversion performed by the A/D converter 532, digital values are properly assigned to signal levels form Level 1 to Level 5. For example, in the case where the signal is converted to a digital signal within a range from 0x00 to 0x9f, Level 1 is assigned to a range from 0x00 to 0x1f, Level 2 to a range from 0x20 to 0x3f, Level 3 to a range from 0x40 to 0x5f, Level 4 to a range from 0x60 to 0x7f, and Level 5 to a range from 0x80 to 0x9f such that the digital output signal increases with increasing input signal from Level 1 to Level 5.

The digital output signal transmitted from the transmitting device 11 of the remote control device 1 is received by the receiving device 7 of the video recording/playback device 5. In accordance with the received signal, a control circuit including a CPU (central processing unit) outputs a control signal to a recording/playback system in the video recording/playback device 5 such that the operation performed by a user upon the remote control device 1 is reflected in the operation of the video recording/playback device 5.

When one of the control buttons having an analog switch 30 with the above-described structure is pressed, the level of the output signal varies depending upon the pressing force applied by the user to the operating element 31 (41 in FIG. 5A), and thus the control circuit determines a control signal corresponding to the level in accordance with information described in Table 1 and supplies the resultant control signal to the recording/playback system.

TABLE 1

| Pushing-down Force | Stop Button | Fast-Forward Button | Rewind Button |
|---|---|---|---|
| Level 1 | Pause | Normal speed | Normal rewinding speed |
| Level 2 | Pause | Normal speed | Normal rewinding speed |
| Level 3 | Stop | Double speed | Double rewinding speed |
| Level 4 | Stop | Double speed | Quadruple rewinding speed |
| Level 5 | Stop | Double speed | Octuple rewinding speed |

For example, if the user presses the rewind button 17 with a weak force, a digital signal at Level 1 or 2 is output, and the video recording/playback device 5 performs a rewinding operation at normal rewinding speed. When the rewind operation at normal rewinding speed. When the rewind button 17 is pressed with a moderate force, a digital signal at Level 3 is output thereby causing the video recording/playback device 5 to perform a rewinding operation at double speed. If the rewind button 17 is pressed with a greater force, a digital signal at Level 4 is output thereby causing a quadruple-speed rewinding operation. The pressing of the rewind button 17 with a further increased force results in a digital signal at Level 5 which causes an octuble-speed rewinding operation. Thus, it is possible to perform multi-stage operation only with a single control button.

Although in the present embodiment, five signal levels are used, the number of signal levels may be set to an arbitrary value by means of the method shown in FIG. 5. Furthermore, even when five signal levels are employed, it is possible to use a single control button including the pressure-sensitive resistor 35 to specify a desired number of levels by outputting the same control signal over a range including a plurality of levels as is the case with the pause button 15 shown in Table 1.

The present embodiment has various effects as described below.

By forming the control buttons 15 to 17 using the analog switch 30 including the pressure-sensitive resistor 35, it becomes possible to use a single control button to specify a plurality of functions thereby allowing a reduction in the number of control buttons 12 to 19 provided on the remote control device 1 and also allowing the remote control device 1 to be used in a simpler fashion.

Furthermore, because the transmitting device 11 of the remote control device 1 outputs a signal in digital form produced by the A/D converter 532, a signal precisely corresponding to the pressing condition of the operating element 31 without any influence of noise or the like is output to the video recording/playback device 5 thereby causing the video recording/playback device 5 to correctly operate in accordance with an operation performed by a user upon the remote control device 1.

Furthermore, the remote control device 1 has the level correction unit 531 for correcting the upper and lower limit levels of the analog signal output from the analog switch 30 to the calibrated level, thereby correcting the output level of the pressure-sensitive resistor 35 and thus ensuring that the output signal level precisely corresponds to the pressing force regardless of variations or deviations in the resistance.

Another advantage is that because an AV device such as the video recording/playback device 5 is controlled by the remote control device 1 including control buttons having the analog switch 30, operations such as a fast-forward operation and a rewind operation of the AV device can be controlled at various discrete speed levels. The remote control device 1 having such control buttons can be easily operated by a user in a natural fashion.

Still another advantage is that use of control buttons having the analog switch 30 in the remote control device 1 for remotely controlling the television set 3 and the video recording/playback device 3 allows the remote control device 1 to be realized in a simple form. Furthermore, the use of such control buttons makes it possible for a user to control the operation in an easier fashion.

Although the present invention has been described with reference to particular embodiments, the invention is not limited to such embodiments, and various modifications and changes are possible.

For example, although in the embodiments described above, the remote control device 1 is formed so as to control both the television set 3 and the video recording/playback device 5, the present invention may also be applied to a remote control device for controlling only one of these electronic devices, or to a remote control device for controlling another type of electronic device such as a CD player or a stereo player.

In the embodiments described above, the remote control device 1 employs a wireless communication system using an infrared light emitting diode. Alternatively, the remote control device may be connected via a cable to a device to be controlled.

Furthermore, instead of the wireless communication using the infrared light emitting diode, another type of wireless communication system using light or ultrasonic waves may also be employed.

The detailed structures and shapes employed in the above-described embodiments may be modified within the scope the present invention.

Figure 10:
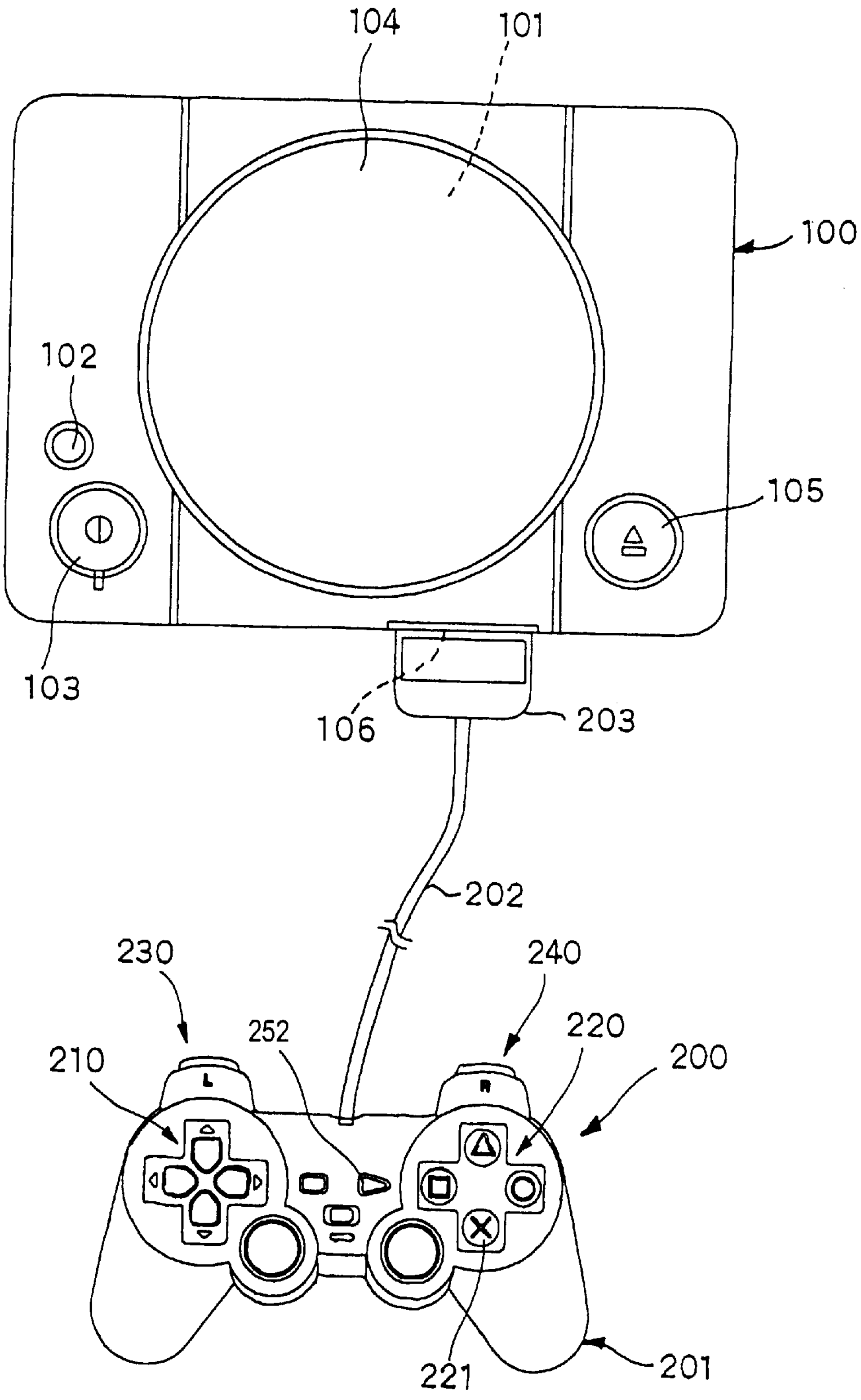
FIG. 10 is a plan view illustrating the concept of an entertainment system.

A specific example of a modification is an entertainment system. FIG. 10 illustrates the appearance of an exemplary entertainment system. This entertainment system can be used as a videogame machine by loading a game software program recording on a storage medium such as a CD-ROM or a DVD-ROM. The entertainment system can also be used as a video player for playing back a movie stored on a storage medium.

The videogame machine includes a main unit 100 connected to a television set (not shown) used as a display and also includes a control device 200 connected to the main unit 100.

The main unit 100 includes a disk drive 101 for reading a game program stored on an optical disk and an image processing unit for performing image processing in accordance with the game program stored on the optical disk. The main unit 100 also includes a reset switch 102 for resetting the game program being executed, a power switch 103, and a lid opening button 150 for opening/closing a lid 104 of a disk loading part of the disk drive 101.

The control device 200 is connected to the main unit 100 via a connection cable 202 extending outward from the control device 200. A connector 203 is disposed at the end of the connection cable 202 so that the control device 200 can be connected to the main unit 100 by fitting the connector 203 in a jack 106 disposed on one side face of the main unit 100.

A first control unit 210 and a second control unit 220 are disposed on the upper surface of a main unit 201 of the control device 200. Furthermore, a third control unit 230 and a forth control unit 240 are disposed on a side of the main unit 201 of the control device 200.

When the videogame machine is used as a DVD player, compressed video or audio information such as a movie data stored on a DVD (digital video disk or digital versatile disk) loaded into disk loading unit is decompressed (expanded) and a movie is played back. When such data is read from a DVD, operations such as play, search, skip, and pause are required. Control buttons for such operations may be assigned to for example, a start button 252, a control button 221 of the second control unit 220, and control buttons of the third and fourth control units 230 and 240. More specifically, the start button 252 may be used as a play button, the third control unit 230 may be used as a skip button, the fourth control unit 240 may be used as a search button, and the control button 221 labeled with a mark "X" of the second control unit 220 may be used as a stop button.

These control buttons may be formed into a structure similar to that of the analog switch 30 such that the output voltage is varied by a variation in resistance caused by a pressing force applied to the control button, thereby switching the control function assigned to the button. For example, when the stop button is pressed with a strong force, a complete stop command is generated, while a pause command is generated when it is pressed with a weak force. When the control buttons of the third and fourth control unit 230 and 240 are pressed with a strong force, a double-speed skip and search commands are generated, respectively. On the other hand, weak pressing of these control buttons generates normal-speed skip and search commands.

Thus, the main unit 100 of the videogame machine may be used as a DVD player, and the control device 200 may be used as a cable-connected remote control device for controlling the DVD player. In this case, if the remote control device is operated, a control signal is transmitted to the DVD player, and the DVD player operates in accordance with the received control signal. The control device 200 may also be connected to the DVD player via a wireless communication system using infrared rays or the like, as in the system shown in FIG. 1.

As described above, in the present invention, because the control buttons of the remote control device are formed of an analog switch including a pressure-sensitive resistor, it is possible to use a single button for a plurality of functions depending upon the pressing force applied to the operating element. Thus, it is possible to reduce the number of buttons, and a user can easily control an electronic device in a simpler fashion.

What is claimed is:

1. A remote control device for controlling an electronic device, comprising:

an analog switch having an operating element capable of being pressed down and a pressure-sensitive resistor for outputting an analog signal having various levels depending upon a pressing force applied to said operating element; and a level correction unit for correcting upper and lower limit levels of the analog signal output from said analog switch to corresponding calibrated levels.

2. A remote control device according to claim 1, further comprising an analog-to-digital converter for converting the analog signal output from said analog switch into a digital signal.

3. A remote control device according to claim 1, wherein the conduction characteristic of said pressure-sensitive resistor varies depending upon the applied pressure.

4. A remote control device according to claim 1, wherein said pressure-sensitive resistor includes a resistor and a conductive element, and the contact area therebetween varies depending upon the applied pressure.

5. A remote control device according to claims 1 or 2, wherein said electronic device is an information reading/writing device for performing at least one of reading and writing of information from and to, respectively, a recording medium, wherein said information is at least one of sound information and image information.

6. A remote control device according to claim 5, wherein said analog switch is disposed in a retrieval control button for retrieving the information recorded on said recording medium.

7. A remote control device according to claim 5, wherein said analog switch is disposed in a stop button for stopping one of an information reading operation and an information writing operation from and to, respectively, said recording medium.

8. An entertainment apparatus comprising;

a processor;

a control device for controlling the processor, wherein said control device includes an analog switch comprising an operating element capable of being pressed down and a pressure-sensitive resistor for outputting an analog signal having various levels depending upon a pressing force applied to the operating element; and a level correction unit for correcting upper and lower limit levels of the analog signal output from said analog switch to corresponding calibrated levels.

* * * * *

UNITED STATES PATENT AND TRADEMARK OFFICE
CERTIFICATE OF CORRECTION

PATENT NO. : 6,509,848 B1
DATED : January 21, 2003
INVENTOR(S) : Hiroki Ogata, Kazusato Tagawa and Hiroyuki Nakazawa It is certified that error appears in the above-identified patent and that said Letters Patent is hereby corrected as shown below:

Title page,
Item [*] Notice, “67 days” should read -- 0 day(s) --.

Column 1,
Line 50, “invention” should read -- invention, --.

Column 2,
Line 1, “various” should read -- varies --.
Line 18, “level” should read -- levels --.
Line 55, “recording” should read -- recorded --.

Column 4,
Line 17, “on” should read -- in --.
Line 67, “The” should read -- This --.

Column 5,
Line 10, “The” should read -- the --.

Column 6,
Line 41, “register” should read -- resistor 40 --.

Column 7,
Line 2, delete “circuit”.
Line 8, “level” should read -- levels --.
Line 13, “implied” should read -- imposed --.
Line 21, “input” should read -- output --.
Line 37, after “resultant” insert -- digital --.

UNITED STATES PATENT AND TRADEMARK OFFICE

CERTIFICATE OF CORRECTION

PATENT NO. : 6,509,848 B1 
DATED : January 21, 2003
INVENTOR(S) : Hiroki Ogata, Kazusato Tagawa and Hiroyuki Nakazawa It is certified that error appears in the above-identified patent and that said Letters Patent is hereby corrected as shown below:

Column 8,
Line 15, delete "When the rewind".
Line 16, delete "operation at normal rewinding speed".

Column 9,
Line 39, "recording" should read -- recorded --.
Line 66, "forth" should read -- fourth --.

Signed and Sealed this

First Day of July, 2003

JAMES E. ROGAN
*Director of the United States Patent and Trademark Office*